(12) United States Patent
Hwang (10) Patent No.: US 10,637,464 B2
(45) Date of Patent: Apr. 28, 2020

(54) SEMICONDUCTOR DEVICE AND SYSTEM INCLUDING THE SAME

(71) Applicant: SK hynix Inc., Icheon-si, Gyeonggi-do (KR)

(72) Inventor: Kyu Dong Hwang, Cheongju-si (KR)

(73) Assignee: SK hynix Inc., Icheon-so, Gyeonggi-do (KR)

( * ) Notice: Subject to any disclaimer, the term of this patent is extended or adjusted under 35 U.S.C. 154(b) by 149 days.

(21) Appl. No.: 15/725,593

(22) Filed: Oct. 5, 2017

(65) Prior Publication Data
US 2018/0226965 A1    Aug. 9, 2018

(30) Foreign Application Priority Data

Feb. 8, 2017    (KR) .................. 10-2017-0017506

(51) Int. Cl.
| | | |
|---|---|---|
| H03B 1/00 | (2006.01) |
| H03K 3/00 | (2006.01) |
| H03K 17/284 | (2006.01) |
| H03K 21/02 | (2006.01) |
| H03K 5/159 | (2006.01) |
| H03K 5/00 | (2006.01) |

(52) U.S. Cl.
CPC .......... *H03K 17/284* (2013.01); *H03K 5/159* (2013.01); *H03K 21/026* (2013.01); *H03K 2005/00058* (2013.01)

(58) Field of Classification Search
CPC .............................. H03K 17/284; H03K 5/159
USPC ......................................................... 327/108
See application file for complete search history.

(56) References Cited

U.S. PATENT DOCUMENTS

| | | | |
|---|---|---|---|
| 8,729,944 B2 | 5/2014 | Doyle et al. | |
| 8,780,649 B2 | 7/2014 | Pant et al. | |
| 2006/0267649 A1* | 11/2006 | Park ..................... | H03K 5/1565 327/158 |

* cited by examiner

*Primary Examiner* — Metasebia T Retebo
(74) *Attorney, Agent, or Firm* — William Park & Associates Ltd.

(57) ABSTRACT

A semiconductor apparatus may be provided. The semiconductor apparatus may include a first buffer configured to generate a first preliminary clock and a first preliminary clock bar based on an external clock, an external clock bar, and a node voltage code. The semiconductor apparatus may include a node voltage control circuit configured to generate the node voltage code based on a control code.

19 Claims, 4 Drawing Sheets

SEMICONDUCTOR DEVICE AND SYSTEM INCLUDING THE SAME

CROSS-REFERENCES TO RELATED APPLICATION

The present application claims priority under 35 U.S.C. § 119(a) to Korean application number 10-2017-0017506, filed on Feb. 8, 2017, in the Korean Intellectual Property Office, which is incorporated herein by reference in its entirety.

BACKGROUND

1. Technical Field

Various embodiments may generally relate to a semiconductor device, and more particularly, to a semiconductor apparatus and system including the same.

2. Related Art

With the high speeds of semiconductor apparatuses, the semiconductor apparatuses are configured to determine a signal, which is input in synchronization with a clock, to operate according to the determined result.

A margin between signals in determining the signals may be insufficient as the frequency of the clock is increased.

The semiconductor apparatuses may be configured to increase the signal determination margin by determining the signals through dividing the clock having a high frequency.

SUMMARY

In an embodiment of the present disclosure, a semiconductor apparatus may be provided. The semiconductor apparatus may include a first buffer configured to generate a first preliminary clock and a first preliminary clock bar based on an external clock, an external clock bar, and a node voltage code. The semiconductor apparatus may include a node voltage control circuit configured to generate the node voltage code based on a control code.

In an embodiment of the present disclosure, a semiconductor apparatus may be provided. The semiconductor apparatus may include a node voltage control circuit configured to generate a node voltage code based on a control code. The semiconductor apparatus may include a first buffer configured to generate a first preliminary clock and a first preliminary clock bar based on an external clock, an external clock bar, and the node voltage code. The semiconductor apparatus may include a delay control circuit configured to generate a delay code based on the control code. The semiconductor apparatus may include a second buffer configured to generate a second preliminary clock and a second preliminary clock bar based on the first preliminary clock, the first preliminary clock bar, and the delay code.

These and other features, aspects, and embodiments are described below in the section entitled "DETAILED DESCRIPTION".

DETAILED DESCRIPTION

Various embodiments will be described below with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present disclosure as defined in the appended claims.

The present disclosure is described herein with reference to cross-section and/or plan illustrations of idealized embodiments of the present disclosure. However, embodiments of the present disclosure should not be construed as limiting the concepts. Although a few embodiments will be illustrated and described, it will be appreciated by those of ordinary skill in the art that changes may be made in these embodiments without departing from the principles and spirit of the present disclosure.

Figure 1:
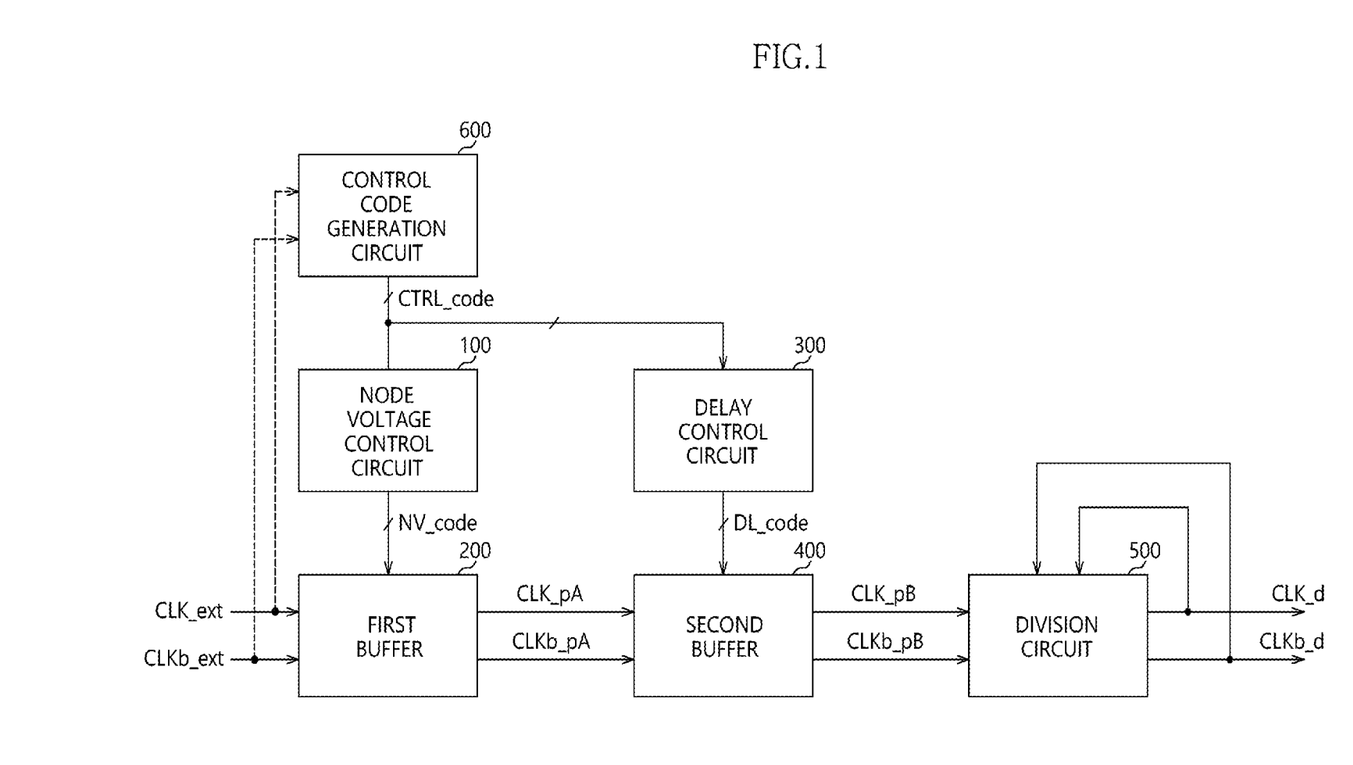
FIG. 1 is a diagram illustrating a configuration of a semiconductor apparatus according to an embodiment of the present disclosure.

Referring to FIG. 1, a semiconductor apparatus according to an embodiment may include a node voltage control circuit 100, a first buffer 200, a delay control circuit 300, a second buffer 400, a division circuit 500, and a control code generation circuit 600.

The node voltage control circuit 100 may generate a node voltage code NV_code in response to a control code CTRL_code. For example, the node voltage control circuit 100 may generate the node voltage code NV_code which may determine a voltage difference between specific nodes (see Node_A and Node_B of FIG. 2) of the first buffer 200 in response to the control code CTRL_code. The node voltage control circuit 100 may generate the node voltage code NV_code by encoding or decoding the control code CTRL_code and the node voltage control circuit 100 may be implemented with an encoding and decoding circuit.

The first buffer 200 may include the specific nodes Node_A and Node_B and generate a first preliminary clock CLK_pA and a first preliminary clock bar CLKb_pA by buffering an external clock CLK_ext and an external clock bar CLKb_ext. In an embodiment, for example, the first buffer 200 may toggle the first preliminary clock CLK_pA and the first preliminary clock bar CLKb_pA when the external clock CLK_ext and the external clock bar CLKb_ext are toggled.

The delay control circuit 300 may generate a delay code DL_code in response to the control code CTRL_code. The delay control circuit 300 may generate the delay code DL_code by encoding or decoding the control code CTRL_code and the delay control circuit 300 may be implemented with an encoding and decoding circuit.

The second buffer 400 may amplify voltage levels of the first preliminary clock CLK_pA and the first preliminary clock bar CLKb_pA and generate a second preliminary clock CLK_pB and a second preliminary clock bar CLKb_pB by delaying the amplified signals in response to the delay code DL_code.

The division circuit 500 may generate a divided clock CLK_d and a divided clock bar CLKb_d by performing a division operation in response to the second preliminary clock CLK_pB and the second preliminary clock bar CLKb_pB.

The control code generation circuit 600 may store a code value of the control code CTRL_code in response to a signal input from an external apparatus, for example, a controller and output the control code CTRL_code having the stored code value. The control code generation circuit 600 may generate the control code CTRL_code by detecting noise generated when signals input to the first buffer 100, for example, the external clock CLK_ext and the external clock bar CLKb_ext are not toggled.

Figure 2:
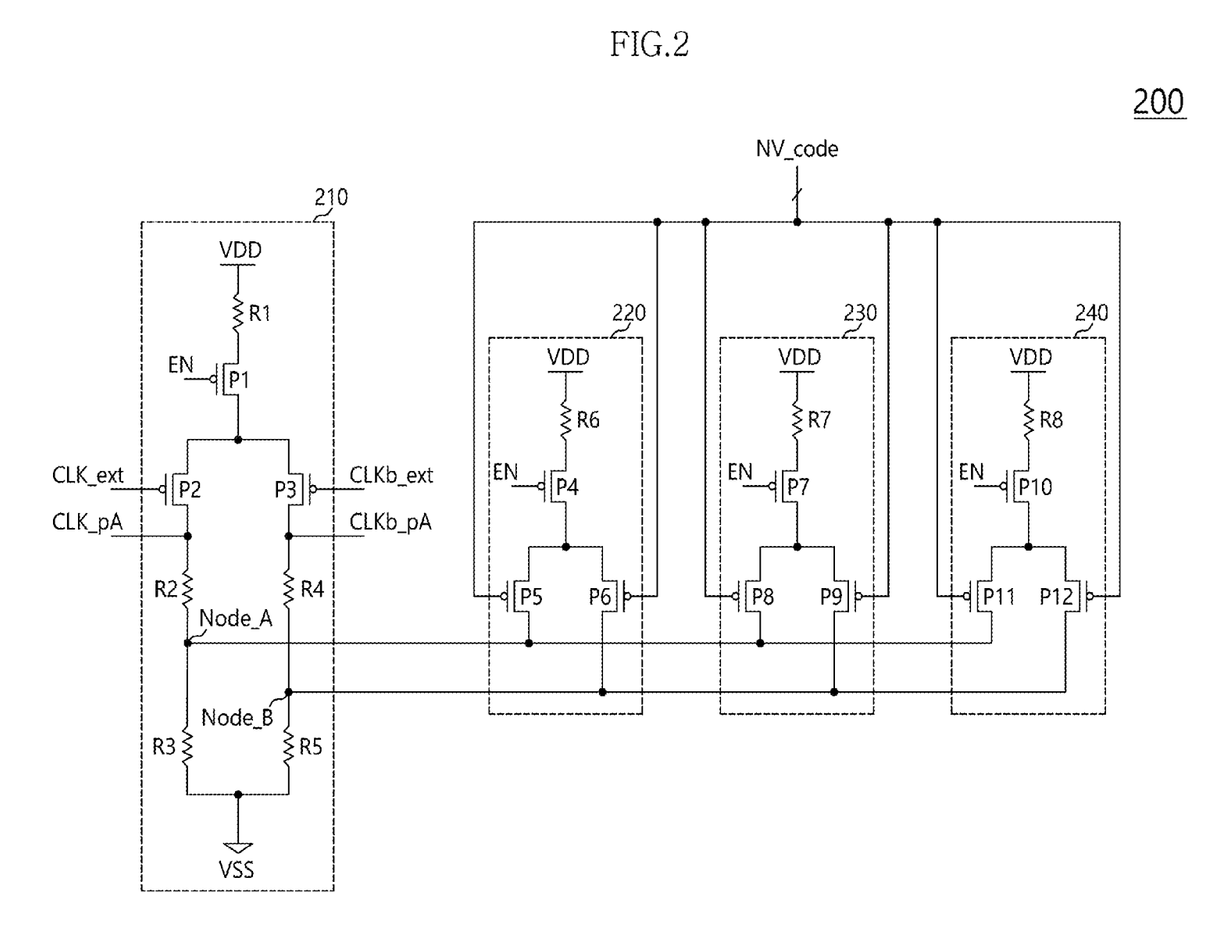
FIG. 2 is a diagram illustrating a configuration of a first buffer of FIG. 1.

Referring to FIG. 2, the first buffer 200 may include an input circuit 210 and first to third node level control circuits 220, 230, and 240.

The input circuit 210 may determine the voltage levels of the first preliminary clock CLK_pA and the first preliminary clock bar CLKb_pA according to the external clock CLK_ext and the external clock bar CLKb_ext based on voltage levels of a first node Node_A and a second Node_B and output the first preliminary clock CLK_pA and the first preliminary clock bar CLKb_pA.

The input circuit 210 may include first to fifth resistor elements R1, R2, R3, R4, and R5 and first to third transistors P1, P2, and P3. One end of the first resistor element R1 may receive an external voltage VDD. A gate of the first transistor P1 may receive an enable signal EN and a source thereof may be coupled to the other end of the first resistor element R1. A gate of the second transistor P2 may receive the external clock CLK_ext and a source thereof may be coupled to a drain of the first transistor P1. A gate of the third transistor P3 may receive the external clock bar CLKb_ext and a source thereof may be coupled to the drain of the first transistor P1. One end of the second resistor element R2 may be coupled to a drain of the second transistor P2. One end of the third resistor element R3 may be coupled to the other end of the second resistor element R2 and other end thereof may be coupled to a ground terminal VSS. One end of the fourth resistor element R4 may be coupled to a drain of the third transistor P3. One end of the fifth resistor element R5 may be coupled to the other end of the fourth resistor element R4 and the other end thereof may be coupled to the ground terminal VSS. The first preliminary clock CLK_pA may be output through a node in which the second transistor P2 and the second resistor element R2 are coupled. The first preliminary clock bar CLKb_pA may be output through a node in which the third transistor P3 and the fourth resistor element R4 are coupled.

An operation of the input circuit 210 having an above-described configuration will be described below.

The input circuit 210 may determine the voltage levels of the first preliminary clock CLK_pA and the first preliminary clock bar CLKb_pA according to a voltage level difference between the external clock CLK_ext and the external clock bar CLKb_ext and output the first preliminary clock CLK_pA and the first preliminary clock bar CLKb_pA. Initial voltage levels of the first preliminary clock CLK_pA and the first preliminary clock bar CLKb_pA may be determined according to the voltage levels of the first and second nodes Node_A and Node_B. For example, it may be assumed that voltage drops of the second and fourth resistor elements R2 and R4 are 1 volt, the voltage level of the first node Node_A is 1.5 V, and the voltage level of the second node Node_B is 1 V. The voltage level of the first preliminary clock CLK_pA may be further increased or reduced rather than 2.5 V according to the voltage levels of the external clock CLK_ext and the external clock bar CLKb_ext and the voltage level of the first preliminary clock bar CLKb_pA may be further increased or reduced rather than 2.0 V according to the voltage levels of the external clock CLK_ext and external clock bar CLKb_ext.

The first to third node level control circuits 220 to 240 may determine the voltage levels of the first and second nodes Node_A and Node_B in response to the node voltage code NV_code.

The first node level control circuit 220 may include a sixth resistor element R6 and fourth to sixth transistors P4, P5, and P6. One end of the six resistor element R6 may receive the external voltage VDD. A gate of the fourth transistor P4 may receive the enable signal EN and a source thereof may be coupled to the other end of the sixth resistor element R6. A gate of the fifth transistor P5 may receive one bit signal among bits constituting the node voltage code NV_code, a source thereof may be coupled to a drain of the fourth transistor P4, and a drain thereof may be coupled to the first node Node_A. A gate of the sixth transistor P6 may be receive one bit signal among the bits of the node voltage code NV_code, a source thereof may be coupled to the drain of the fourth transistor P4, and a drain thereof may be coupled to the second node Node_B.

The second node level control circuit 230 may include a seventh resistor element R7 and seventh to ninth transistors P7, P8, and P9. One end of the seventh resistor element R7 may receive the external voltage VDD. A gate of the seventh transistor P7 may receive the enable signal EN and a source thereof may be coupled to the other end of the seventh resistor element R7. A gate of the eighth transistor P8 may receive one bit signal among the bits of the node voltage code NV_code, a source thereof may be coupled to a drain of the seventh transistor P7, and a drain thereof may be coupled to the first node Node_A. A gate of the ninth transistor P9 may receive one bit signal among the bits of the node voltage code NV_code, a source thereof may be coupled to the drain of the seventh transistor P7, and a drain thereof may be coupled to the second node Node_B.

The third node level control circuit 240 may include eighth resistor element R8 and tenth to twelfth transistors P10, P11, and P12. One end of the eighth resistor element R8 may receive the external voltage VDD. A gate of the tenth transistor P10 may receive the enable signal EN and a source thereof may be coupled to the other end of the eighth resistor element R8. A gate of the eleventh transistor P11 may receive one bit signal among the bits of the node voltage code NV_code, a source thereof may be coupled to a drain of the tenth transistor P10, and a drain thereof may be coupled to the first node Node_A. A gate of the twelfth transistor P12 may receive one bit signal among the bits of the node voltage code NV_code, a source thereof may be coupled to the drain of the tenth transistor P10, and a drain thereof may be coupled to the second node Node_B. For example, the fifth and sixth transistors P5 and P6 of the first node level control circuit 220, the eighth and ninth transistors P8 and P9 of the second node level control circuit 230, and the eleventh and twelfth transistors P11 and P12 of the third node level control circuit 240 may receive different bit signals among a plurality of bits constituting the node voltage code NV_code. The fifth and sixth transistors P5 and P6, the eighth and ninth transistor P8 and P9, and the eleventh and twelfth transistors P11 and P12 may have different sizes from each other.

The first to third node level control circuits 220 to 240 having the above-described configurations may determine the voltage levels of the first and second nodes Node_A and Node_B in response to the node voltage code NV_code. For example, the first to third node level control circuits 220 to 240 may control the voltage levels of the first and second nodes Node_A and Node_B to be different from each other in response to the node voltage code NV_code.

Figure 3:
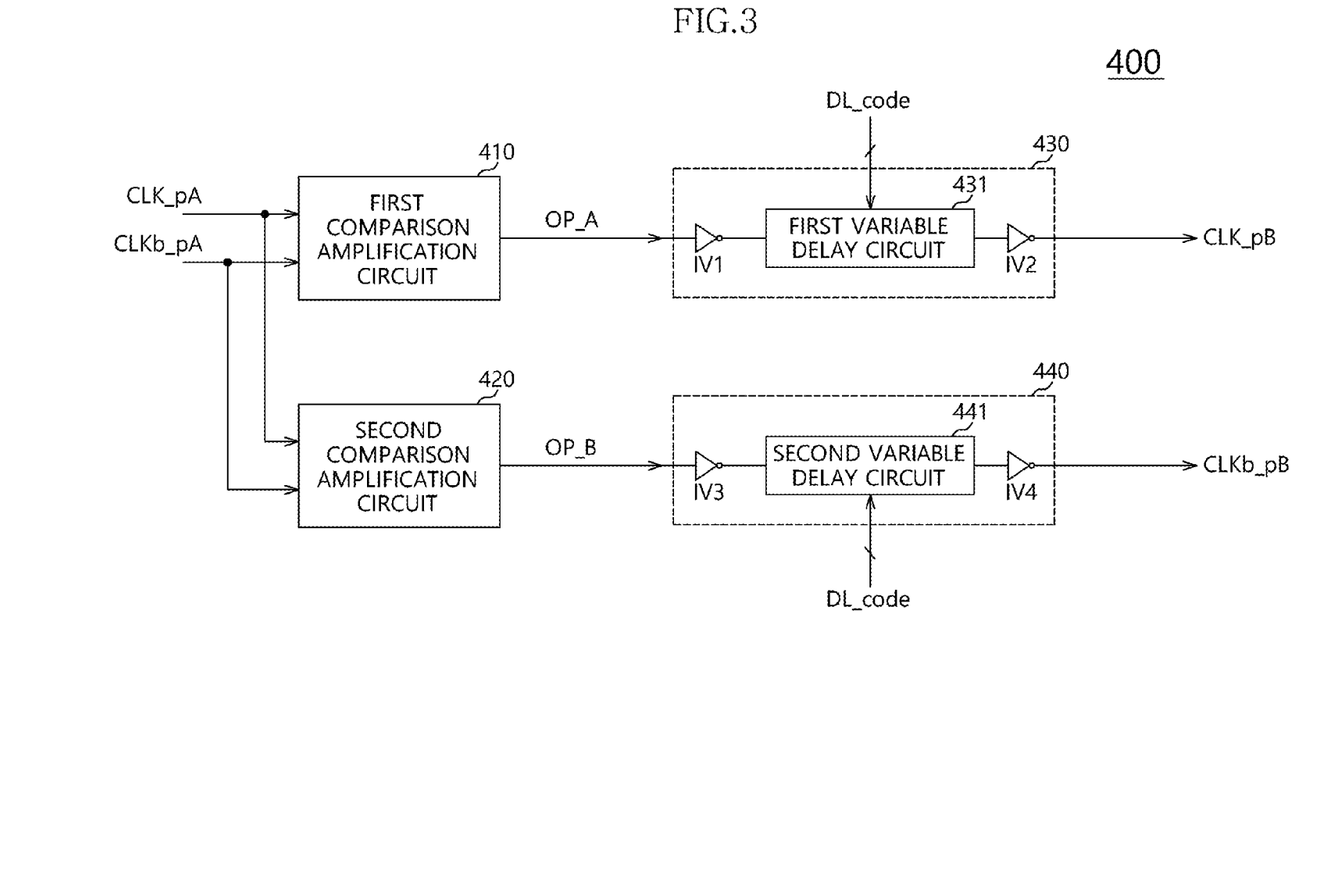
FIG. 3 is a diagram illustrating a configuration of a second buffer of FIG. 1.

Referring to FIG. 3, the second buffer 400 may include first and second comparison amplification circuits 410 and 420 and first and second driving circuits 430 and 440.

The first comparison amplification circuit 410 may generate a first amplification signal OP_A by comparing the voltage levels of the first preliminary clock CLK_pA and the first preliminary clock bar CLKb_pA. For example, the first comparison amplification circuit 410 may be configured of an operational amplifier.

The second comparison amplification circuit 420 may generate a second amplification signal OP_B by comparing the voltage levels of the first preliminary clock CLK_pA and the first preliminary clock bar CLKb_pA. The second comparison amplification circuit 420 may be configured of an operational amplifier. For example, the first and second comparison amplification circuits 410 and 420 may be configured in such a manner that when the first comparison amplification circuit 410 compares the voltage level of the first preliminary clock CLK_pA on the basis of the voltage level of the first preliminary clock bar CLKb_pA, the second comparison amplification circuit 420 compares the voltage level of the first preliminary clock bar CLKb_pA on the basis of the voltage level of the first preliminary clock CLK_pA.

The first driving control circuit 430 may determine a delay time in response to the delay code DL_code and output the second preliminary clock CLK_pB by delaying and driving the first amplification signal OP_A based on the determined delay time.

The first driving control circuit 430 may include first and second inverters IV1 and IV2 and a first variable delay circuit 431. The first inverter IV1 may receive the first amplification signal OP_A. The first variable delay circuit 431 may receive the delay code DL_code and an output signal of the first inverter IV1. The second inverter IV2 may output the second preliminary clock CLK_pB by receiving an output signal of the first variable delay circuit 431. The first variable delay circuit 431 may determine the delay time in response to the delay code DL_code, delay the output signal of the first inverter IV1 based on the determined delay time, and output a delayed output signal of the first inverter IV1 to the second inverter IV2.

The second driving control circuit 440 may determine a delay time in response to the delay code DL_code and output the second preliminary clock bar CLKb_pB by delaying and driving the second amplification signal OP_B based on the determined delay time.

The second driving control circuit 440 may include third and fourth inverters IV3 and IV4 and a second variable delay circuit 441. The third inverter IV3 may receive the second amplification signal OP_B. The second variable delay circuit 441 may receive the delay code DL_code and an output signal of the third inverter IV3. The fourth inverter IV4 may output the second preliminary clock bar CLKb_pB by receiving an output signal of the second variable delay circuit 441. The second variable delay circuit 441 may determine the delay time in response to the delay code DL_code, delay the output signal of the third inverter IV3 based on the determined delay time, and output a delayed output signal of the third inverter IV3 to the fourth inverter IV4.

The first and second variable delay circuits 431 and 441 may be configured in such a manner that only the delay time of one of the first and second variable delay circuits 431 and 441 is determined in response to the delay code DL_code. For example, only the delay time of the first variable delay circuit 431 of the first and second variable delay circuits 431 and 441 may be determined in response to the delay code DL_code and the delay time of the second variable delay circuit 441 may be fixed to a basic delay time or an initial value. In another example, only the delay time of the second variable delay circuit 441 of the first and second variable delay circuits 431 and 441 may be determined in response to the delay code DL_code and the delay time of the first variable delay circuit 431 may be fixed to the basic delay time or the initial value. In an embodiment, for example, the second buffer 400 increases a delay time of one of the second preliminary clock CLK_pB and the second preliminary clock bar CLKb_pB and fixes a delay time of the remaining one to a basic delay time or an initial value, based on the delay code DL_code.

The first and second variable delay circuits 431 and 441 may be configured in such a manner that when the delay time of one of the first and second variable delay circuits 431 and 441 is increased in response to the delay code DL_code, the delay time of the other variable delay circuit is reduced. For example, when the delay time of the first variable delay circuit 431 of the first and second variable delay circuits 431 and 441 is increased in response to the delay code DL_code, the delay time of the second variable delay circuit 441 may be reduced. In another example, when the delay time of the second variable delay circuit 441 of the first and second variable delay circuits 431 and 441 is increased in response to the delay code DL_code, the delay time of the first variable delay circuit 431 may be reduced.

An operation of the semiconductor apparatus having an above-described configuration will be described below.

The node voltage control circuit 100 may generate the node voltage code NV_code in response to the control code CTRL_code.

The first buffer 200 may generate the first preliminary clock CLK_pA and the first preliminary clock bar CLKb_pA in response to the external clock CLK_ext and the external clock bar CLKb_ext. For example, the first buffer 200 may determine the voltage levels of the first and second nodes (see Node_A and Node_B of FIG. 2) of the first buffer 200 in response to the node voltage code NV_code. In this example, the initial voltage level of the first preliminary clock CLK_pA may be determined based on the voltage level of the first node Node_A and the initial voltage level of the first preliminary clock bar CLKb_pA may be determined based on the voltage level of the second node Node_B. The voltage levels of the first and second nodes Node_A and Node_B may be different from each other.

An operation of the first buffer 200 will be described below with reference to FIG. 2.

The input circuit 210 may generate the first preliminary clock CLK_pA and the first preliminary clock bar CLKb_pA in response to the voltage levels of the external clock CLK_ext and the external clock bar CLKb_ext when the enable signal EN is enabled. For example, the input circuit 210 may increase the voltage level of one of the first preliminary clock CLK_pA and the first preliminary clock bar CLKb_pA and drop the voltage level of the remaining one in response to the voltage levels of the external clock CLK_ext and the external clock bar CLKb_ext when the enable signal EN is enabled. In this example, as a difference between the voltage levels of the external clock CLK_ext and the external clock bar CLKb_ext is increased, slew rates of rising edges and falling edges of the first preliminary clock CLK_pA and the first preliminary clock bar CLKb_pA in the input circuit 210 may be increased.

The first to third node level control circuits 220 to 240 may determine the voltage levels of the first node Node_A and the second node Node_B in response to the node voltage code NV_code. The initial voltage level of the first preliminary clock CLK_pA may be determined based on the voltage level of the first node Node_A and the initial voltage level of the first preliminary clock bar CLKb_pA may be determined based on the voltage level of the second node Node_B. For example, it may be assumed that the voltage drops of the second and fourth resistor elements R2 and R4 are 1V, the voltage level of the first node Node_A is 1.5 V, and the voltage level of the second node Node_B is 1 V. The voltage level of the first preliminary clock CLK_pA may be further increased or reduced rather than 2.5 V according to the voltage levels of the external clock CLK_ext and the external clock bar CLKb_ext and the voltage level of the first preliminary clock bar CLKb_pA may be further increased or reduced rather than 2.0 V according to the voltage levels of the external clock CLK_ext and the external clock bar CLKb_ext.

The second buffer 400 may amplify the voltage levels of the first preliminary clock CLK_pA and the first preliminary clock bar CLKb_pA and generate the second preliminary clock CLK_pB and the second preliminary clock bar CLKb_pB by delaying the amplified signals in response to the delay code DL_code.

Accordingly, the input circuit 210 may operate to determine the initial voltage levels of the first preliminary clock CLK_pA and the first preliminary clock bar CLKb_pA based on the voltage levels of the first and second nodes Node_A and Node_B which are determined in response to the node voltage code NV_code and to further increase or reduce the voltage levels of the first preliminary clock CLK_pA and the first preliminary clock bar CLKb_pA rather than the initial voltage levels in response to the voltage levels of the external clock CLK_ext and the external clock bar CLKb_ext. When one of the voltage levels of the first preliminary clock CLK_pA and the first preliminary clock bar CLKb_pA is increased, the voltage level of the remaining one may be reduced.

An operation of the second buffer 400 will be described below with reference to FIG. 3.

The first comparison amplification circuit 410 may generate the first amplification signal OP_A by comparing the voltage levels of the first preliminary clock CLK_pA and the first preliminary clock bar CLKb_pA.

The second comparison amplification circuit 420 may generate the second amplification signal OP_B by comparing the voltage levels of the first preliminary clock CLK_pA and the first preliminary clock bar CLKb_pA.

The first and second comparison amplification circuits 410 and 420 may be configured in such a manner that when the first comparison amplification circuit 410 compares the voltage level of the first preliminary clock CLK_pA on the basis of the voltage level of the first preliminary clock bar CLKb_pA, the second comparison amplification circuit 420 compares the voltage level of the first preliminary clock bar CLKb_pA on the basis of the voltage level of the first preliminary clock CLK_pA.

The first driving control circuit 430 may determine a delay time in response to the delay code DL_code and output the second preliminary clock CLK_pB by delaying and driving the first amplification signal OP_A based on the determined delay time.

The second driving control circuit 440 may determine a delay time in response to the delay code DL_code and output the second preliminary clock bar CLKb_pB by delaying and driving the second amplification signal OP_B based on the determined delay time.

The first and second variable delay circuits 431 and the 441 included in the first and second driving control circuits 430 and 440 may be configured in such a manner that only the delay time of one of two variable delay circuits 431 and 441 is determined in response to the delay code DL_code. For example, only the delay time of the first variable delay circuit 431 of the first and second variable delay circuits 431 and 441 may be determined in response to the delay code DL_code and the delay time of the second variable delay circuit 441 may be fixed to a basic delay time or an initial value. In another example, only the delay time of the second variable delay circuit 441 of the first and second variable delay circuits 431 and 441 may be determined in response to the delay code DL_code and the delay time of the first variable delay circuit 431 may be fixed to the basic delay time or the initial value.

When the delay time of one of the first and second variable delay circuits 431 and 441 is increased in response to the delay code DL_code, the delay time of the other variable delay circuit may be reduced. For example, when the delay time of the first variable delay circuit 431 is increased in response to the delay code DL_code, the delay time of the second variable delay circuit 441 may be reduced. In another example, when the delay time of the second variable delay circuit 441 is increased in response to the delay code DL_code, the delay time of the first variable delay circuit 431 may be reduced. In an embodiment, for example, the second buffer may increase a delay time of one of the second preliminary clock CLK_pB and the second preliminary clock bar CLKb_pB and reduces a delay time for the remaining one, based on the delay code DL_code.

The second buffer 400 may amplify the voltage levels of the first preliminary clock CLK_pA and the first preliminary clock bar CLKb_pA and generate the second preliminary clock CLK_pB and the second preliminary clock bar CLKb_pB by delaying the amplified signals in response to the delay code DL_code. For example, only one of the second preliminary clock CLK_pB and the second preliminary clock bar CLKb_pB may be delayed and then output in response to the delay code DL_code.

The division circuit 500 may generate the divided clock CLK_d and the divided clock bar CLKb_d by performing a division operation in response to the second preliminary clock CLK_pB and the second preliminary clock bar CLKb_pB.

The semiconductor apparatus which operates as described above according to an embodiment may determine initial voltage levels of output signals of the first buffer 200, for example, the initial voltage levels of the first preliminary clock CLK_pA and the first preliminary clock bar CLKb_pA in response to the node voltage code NV_code generated based on the control code CTRL_code. Accordingly, the first preliminary clock CLK_pA and the first preliminary clock bar CLKb_pA may not be affected by noise generated when the external clock CLK_ext and the external clock bar CLKb_ext are not toggled. In an embodiment, for example, the first buffer 200 may generate the first preliminary clock CLK_pA and the first preliminary clock bar CLKb_pA based on the external clock CLK_ext and the external clock bar CLKb_ext and determines initial voltage levels of the first preliminary clock CLK_pA and the first preliminary clock bar CLKb_pA in response to the node voltage code NV_code. For example, the first buffer 200 may maintain voltage levels of the first preliminary clock CLK_pA and the first preliminary clock bar CLKb_pA to the initial voltage levels based on the node voltage code NV_code when the external clock CLK_ext and the external clock bar CLKb_ext are not toggled.

For example, the external clock CLK_ext and the external clock bar CLKb_ext may be the input signals of the first buffer 200 and the first preliminary clock CLK_pA and the first preliminary clock bar CLKb_pA may be the output signals of the first buffer 200. The initial voltage levels of the first preliminary clock CLK_pA and the first preliminary clock bar CLKb_pA may be different from each other, that is, a voltage difference between the output signals of the first buffer 200 occurs and thus the reversal in the voltage levels of the output signals of the first buffer 200 due to the noise generated when the input signals of the first buffer 200 are not toggled may be prevented.

The output signals of the first buffer 200 may be input to the second buffer 400 as the input signals and the output signals of the second buffer 400 may be input to the division circuit 500. For example, the semiconductor apparatus according to an embodiment may prevent the phases of the output signals (for example, the divided clock CLK_d and the divided clock bar CLKb_d) of the division circuit 500 from being changed due to the noise which may be included in the input signals of the first buffer 200.

According to the semiconductor apparatus according to an embodiment, the problems due to the noise which may be generated when the input signals are not toggled may be overcome by generating the voltage difference between the output signals of the first butter 200 in response to the node voltage code NV_code generated based on the control code CTRL_code, but the distortion of the duties of the first preliminary clock CLK_pA and the first preliminary clock bar CLKb_pA due to the generated voltage difference may be caused. However, the semiconductor apparatus according to an embodiment may match the duties of the second preliminary clock CLK_pB and the second preliminary clock bar CLKb_pB with each other by generating the delay code DL_code using the control code CTRL_code used for generating the node voltage code NV_code and delaying one of the output signals (for example, the second preliminary clock CLK_pB and the second preliminary clock bar CLKb_pB) of the second buffer 400 in response to the delay code DL_code.

Accordingly, the semiconductor apparatus according to an embodiment may prevent a malfunction due to the noise generated when the external clock CLK_ext and the external clock bar CLKb_ext are not toggled.

The semiconductor apparatuses as discussed above (see FIGS. 1-3) are particular useful in the design of other memory devices, processors, and computer systems. For example, referring to FIG. 4, a block diagram of a system employing a semiconductor apparatus in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

Figure 4:
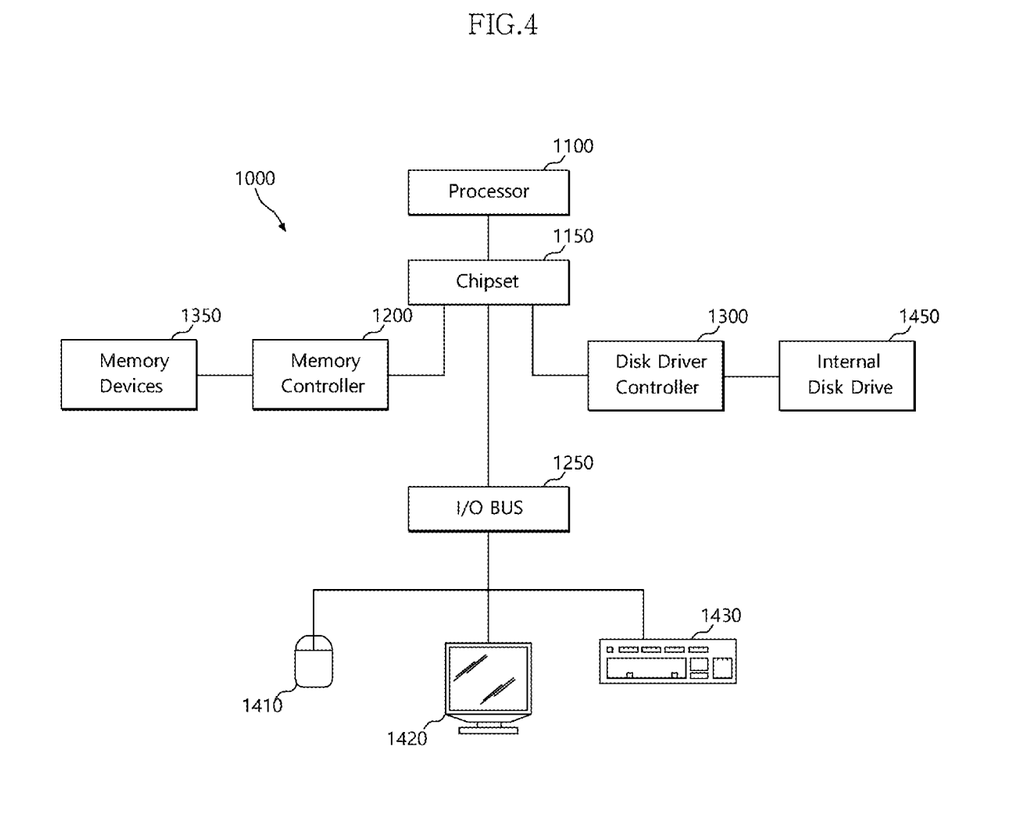
FIG. 4 illustrates a block diagram of an example of a representation of a system employing a semiconductor apparatus with the various embodiments discussed above with relation to FIGS. 1-3.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor apparatus as discussed above with reference to FIGS. 1-3. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor apparatus as discussed above with relation to FIGS. 1-10, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 4 is merely one example of a semiconductor apparatus as discussed above with relation to FIGS. 1-3. In alternate embodiments, such as, for example but not limited to, cellular phones or digital cameras, the components may differ from the embodiments illustrated in FIG. 4.

The above described embodiments of the present disclosure are intended to illustrate and not to limit the present disclosure. Various alternatives and equivalents are possible.

The disclosure is not limited by the embodiments described herein. Nor is the disclosure limited to any specific type of semiconductor device. Other additions, subtractions, or modifications are obvious in view of the present disclosure and are intended to fall within the scope of the appended claims.

What is claimed is:

1. A semiconductor apparatus comprising:
   a first buffer configured to generate a first preliminary clock and a first preliminary clock bar based on an external clock, an external clock bar, and a node voltage code; and
   a node voltage control circuit configured to generate the node voltage code based on a control code,
   wherein the first buffer is configured to increase a voltage level of one of the first preliminary clock and the first preliminary clock bar and lower the voltage level of the remaining one based on voltage levels of the external clock and the external clock bar.

2. The semiconductor apparatus of claim 1, wherein the first buffer generates the first preliminary clock and the first preliminary clock bar based on the external clock and the external clock bar and determines initial voltage levels of the first preliminary clock and the first preliminary clock bar based on the node voltage code.

3. The semiconductor apparatus of claim 2, wherein the first buffer maintains voltage levels of the first preliminary clock and the first preliminary clock bar to the initial voltage levels based on the node voltage code when the external clock and the external clock bar are not toggled.

4. The semiconductor apparatus of claim 3, wherein the first buffer toggles the first preliminary clock and the first preliminary clock bar when the external clock and the external clock bar are toggled.

5. The semiconductor apparatus of claim 1, wherein the first buffer includes:
   an input circuit configured to determine the voltage levels of the first preliminary clock and the first preliminary clock bar based on voltage levels of a first node and a second node thereof based on the external clock and the external clock bar; and
   a plurality of node level control circuits configured to determine the voltage levels of the first and second nodes based on the node voltage code.

6. The semiconductor apparatus of claim 5, wherein the plurality of node level control circuits include transistors which operate based on bit signals of bits constituting the node voltage code.

7. The semiconductor apparatus of claim 1, wherein the node voltage control circuit generates the node voltage code by encoding or decoding the control code.

8. The semiconductor apparatus of claim 1, further comprising:
   a control code generation circuit configured to generate the control code by detecting noise generated when the external clock and the external clock bar input into the first buffer are not toggled.

9. A semiconductor apparatus comprising:
   a node voltage control circuit configured to generate a node voltage code based on a control code;
   a first buffer configured to generate a first preliminary clock and a first preliminary clock bar based on an external clock, an external clock bar, and the node voltage code;
   a delay control circuit configured to generate a delay code based on the control code; and
   a second buffer configured to generate a second preliminary clock and a second preliminary clock bar based on the first preliminary clock, the first preliminary clock bar, and the delay code.

10. The semiconductor apparatus of claim 9, where the node voltage control circuit generates the node voltage code by encoding or decoding the control code, and
    the delay control circuit generates the delay code by decoding or encoding the control code.

11. The semiconductor apparatus of claim 9, wherein the first buffer generates the first preliminary clock and the first preliminary clock bar toggled based on the external clock and the external clock bar being toggled, and determines initial voltage levels of the first preliminary clock and the first preliminary clock bar based on the node voltage code when the external clock and the external clock bar are not toggled.

12. The semiconductor apparatus of claim 11, wherein the first buffer determines the initial voltage levels of the first preliminary clock and the first preliminary clock bar to be different from each other based on the node voltage code.

13. The semiconductor apparatus of claim 9, wherein the second buffer delays one of the second preliminary clock and the second preliminary clock bar based on the delay code.

14. The semiconductor apparatus of claim 9, wherein the second buffer increases a delay time of one of the second preliminary clock and the second preliminary clock bar and reduces a delay time of the remaining one, based on the delay code.

15. The semiconductor apparatus of claim 9, wherein the second buffer increases a delay time of one of the second preliminary clock and the second preliminary clock bar and fixes a delay time of the remaining one to a basic delay time or an initial value, based on the delay code.

16. The semiconductor apparatus of claim 9, further comprising a division circuit configured to generate a divided clock and a divided clock bar based on the second preliminary clock and the second preliminary clock bar.

17. The semiconductor apparatus of claim 9, further comprising:
    a control code generation circuit configured to generate the control code by detecting noise generated when the external clock and the external clock bar input into the first buffer are not toggled.

18. The semiconductor apparatus of claim 9, wherein the first buffer is configured to increase a voltage level of one of the first preliminary clock and the first preliminary clock bar and lower the voltage level of the remaining one based on voltage levels of the external clock and the external clock bar.

19. A semiconductor apparatus comprising:
    a first buffer configured to generate a first preliminary clock and a first preliminary clock bar based on an external clock, an external clock bar, and a node voltage code; and
    a second buffer configured to generate a second preliminary clock and a second preliminary clock bar based on the first preliminary clock, the first preliminary clock bar, and a delay code generated by a control code.

* * * * *